(12) United States Patent
Jaiswal

(10) Patent No.: US 9,322,964 B2
(45) Date of Patent: Apr. 26, 2016

(54) MATERIALS, COMPONENTS, AND METHODS FOR USE WITH EXTREME ULTRAVIOLET RADIATION IN LITHOGRAPHY AND OTHER APPLICATIONS

(71) Applicant: Supriya Jaiswal, San Diego, CA (US)

(72) Inventor: Supriya Jaiswal, San Diego, CA (US)

( * ) Notice: Subject to any disclaimer, the term of this patent is extended or adjusted under 35 U.S.C. 154(b) by 199 days.

(21) Appl. No.: 13/745,618

(22) Filed: Jan. 18, 2013

(65) Prior Publication Data

US 2013/0188245 A1 Jul. 25, 2013

Related U.S. Application Data

(60) Provisional application No. 61/588,601, filed on Jan. 19, 2012.

(51) Int. Cl.
*G02B 5/20* (2006.01)
*G02B 1/00* (2006.01)
*G03F 7/20* (2006.01)
*G02B 5/08* (2006.01)

(52) U.S. Cl.
CPC ............... *G02B 5/208* (2013.01); *G02B 1/005* (2013.01); *G02B 5/085* (2013.01); *G02B 5/0891* (2013.01); *G03F 7/70958* (2013.01)

(58) Field of Classification Search
CPC .... G02B 5/208; G02B 5/0891; G02B 5/0816; G02B 5/26; G02B 5/283; G02B 27/14; G02B 27/142; G02B 1/10; G02B 26/0816; G03B 27/52; G03F 7/20; G03F 7/70

USPC ........... 359/350–361, 577–590; 430/5, 270.1, 430/281.1
See application file for complete search history.

(56) References Cited

U.S. PATENT DOCUMENTS

| | | | | |
|---|---|---|---|---|
| 5,151,819 A | * | 9/1992 | Stephens | B64G 1/54 244/121 |
| 5,672,409 A | * | 9/1997 | Miyakawa | B32B 27/18 428/141 |
| 2004/0051954 A1 | | 3/2004 | Bristol | |
| 2005/0112296 A1 | * | 5/2005 | Laney | G02B 5/0808 428/1.1 |
| 2005/0275818 A1 | | 12/2005 | Singer | |
| 2007/0054196 A1 | | 3/2007 | Lee et al. | |

OTHER PUBLICATIONS

International Search Report and Written Opinion in PCT/US2013/22297 dated Mar. 29, 2013 in 13 pages.

* cited by examiner

*Primary Examiner* — Bumsuk Won
*Assistant Examiner* — Ephrem Mebrahtu

(57) ABSTRACT

Nanostructured photonic materials and associated components for use in devices and systems operating at ultraviolet (UV), extreme ultraviolet (EUV), and/or soft Xray wavelengths are described. Such a material may be fabricated with nanoscale features tailored for a selected wavelength range, such as at particular UV, EUV, or soft Xray wavelengths or wavelength ranges. Such a material may be used to make components such as mirrors, lenses or other optics, panels, lightsources, masks, photoresists, or other components for use in applications such as lithography, wafer patterning, biomedical applications, or other applications.

13 Claims, 5 Drawing Sheets

MATERIALS, COMPONENTS, AND METHODS FOR USE WITH EXTREME ULTRAVIOLET RADIATION IN LITHOGRAPHY AND OTHER APPLICATIONS

RELATED APPLICATION

This application is a non-provisional of U.S. Provisional Application No. 61/588,601, filed Jan. 19, 2012, titled "Materials, Components, and Methods for Use with Extreme Ultraviolet Radiation in Lithography & Other Applications," the disclosure of which is hereby incorporated by reference in its entirety.

BACKGROUND

Optical lithography systems are commonly used for fabrication, for example, devices. The resolving power of such systems is proportional to the exposure wavelength. Thus, shorter wavelengths can improve resolution in fabrication. Extreme ultraviolet lithography (EUVL) uses electromagnetic radiation at extreme ultraviolet (EUV) wavelengths (approximately 120 nanometers to 0.1 nanometers). Accordingly, photons at these wavelengths have energies in the range of approximately 10 electron volts (eV) to 12.4 keV (corresponding to 124 nm and 0.1 nm, respectively). Extreme ultraviolet wavelengths may be generated artificially by devices such as plasma and synchrotron light sources. Using EUV wavelengths for lithography has potential advantages of reducing feature sizes in devices such as semiconductor chips as well as in other applications such as polymer electronics, solar cells, biotech, medical technologies. At EUV wavelengths, the materials used to form the components of the lithography system, for example mirrors, lenses, photoresist, etc. become important. Most materials, however, have a high absorption rate for radiation at EUV wavelengths. Higher absorption in these materials at the EUV wavelengths decreases the performance of EUV lithography systems. For example, EUV lithography systems may need a higher power source to overcome this absorption.

SUMMARY OF THE INVENTION

This disclosure relates generally to materials, devices, apparatus, and methods for use with ultraviolet (UV), extreme ultraviolet (EUV) and soft Xray radiation, such as in lithography (EUVL) or other applications. More specifically, but not exclusively, the disclosure relates to materials and components for use in UV, EUV and soft Xray applications, as well as methods of fabrication and use of such materials and components in apparatus, devices, and systems using EUV radiation.

In certain embodiments, the disclosure relates to an element that can be used in a light exposure system, wherein the system or subsystem includes a light source to transmit light having a wavelength. The element can include a material having plurality of structural features. The plurality of structural features can improve the reflectivity of the element to greater than 70% for a selected wavelength.

In another embodiment, the disclosure relates to an element that can be used in a light exposure system. The system or subsystem can include a light source to transmit light having a wavelength. The element can include a material having plurality of structural features. The plurality of structural features can improve the transmission of the element to greater than 4% for a selected wavelength.

In another embodiment, the disclosure relates to an element that can be used in a light exposure system. The system or subsystem can include a light source to transmit light having a wavelength. The element can include a material having plurality of structural features. The plurality of structural features can control the electromagnetic radiation absorption for a selected wavelength.

In some embodiments, the light exposure system can include a photolithography tool, biotechnology system, scanning or imaging system, astronomical system, material processing system or a printing system.

In one embodiment, the wavelength is less than or equal to 250 nm. The plurality of structural features can have a first size where the first size substantially correlating with the wavelength. In one embodiment, the plurality of structural features have a first size of between 250 nm and 0.01 nm. The plurality of structural features can be one, two, or three dimensional. the plurality of structural features can have a periodicity in the material. The periodicity may be in one, two, or three dimensions. The plurality of structural features can be arranged in one of the following: semi-periodic, aperiodic, quasi-periodic, graded, partially graded, symmetric, fractal, gyroid, swiss roll, non-planar, segments, repeated unit, forming a pattern, or randomly or semi random order in the material. The material can include one or more of the following: metal, dielectric, gas, liquid, compound, semiconductor, polymer, organic material, biological material, monatomic material, air, Carbon, Molybdenum, Beryllium, Lanthanum, Boron Carbide, Silicon, $SiO_2$, $TiO_2$, Ruthenium, Niobium, Rhodium, Gold, Silver, Copper, Platinum, Palladium, Germanium, DNA, proteins, graphene, graphite, carbon nanotubes, MoS, 02, N2, He, H2, Ar, $CO_2$ The structural features can include one or more of the following' metal, dielectric, gas, liquid, compound, semiconductor, polymer, organic material, biological material, monatomic material, air, Carbon, Molybdenum, Beryllium, Lanthanum, Boron Carbide, Silicon, $SiO_2$, $TiO_2$, Ruthenium, Niobium, Rhodium, Gold, Silver, Copper, Platinum, Palladium, Germanium, DNA, proteins, graphene, graphite, carbon nanotubes, or MoS, 02, N2, He, H2, Ar, $CO_2$, vacuum or voids. The plurality of structural features can have shapes or dimensions containing layers, films, spheres, blocks, pyramids, rings, porous structures, cylinders, linked shapes, shells, freeform shapes, chiral structures, hemispheres or segments.

In some embodiments, the element can be a substrate, mirror, lens, surface, window, facet, filter, covering element, capping layer, protective layer, barrier layer, thin film, coating, internal surface area, collector, droplet generator, interdispersed material, panel, waveguide, cavity, fiber, structural component, reflective element, transmissive element, a detector, a wavelength monitor, bandwidth or power monitor, sensors, a photomask, photoresist, a cooling mechanism, a heat management mechanism, light source, lamp, laser, optical element, mask aligner, integrator, structural component. optical device, electrical device.

In some embodiments, the material or structural features can be cleaned or post processed by one of the following methods of processing: chemical etching, laser radiation or heating.

In one embodiment, the material or subset of the material or aspect of the material can be fabricated by one of the following methods of processing: self-assembly, directed assembly, soft templating, electroforming, electroplating, sacrificial or scaffolding materials, block co-polymers, bottom-up techniques, EUV or XUV lithography, focused electron or ion beams, nanoimprinting, atomic force or scanning probe microscopy, two or more photon lithography, laser irradiation, dealloying, chemical etching, chemical surfactants, surface treatments.

In certain embodiments, the disclosure provides a method of fabricating a material that can have a reflectivity of more than 70% at a wavelength. The method can include the step of polishing a host layer. In some embodiments, the method can further include the step of assembling a polymeric or scaffolding structure. Moreover, the method can include growing a main layer over the scaffolding structure. The method can also include polishing the surface of the main layer. Furthermore, the method can include the step of removing the polymeric or scaffolding structure so that the reflectivity of the material is greater than 70% at a wavelength between 0.1 nm and 250 nm. In some embodiments, the method can include the step of smoothing one or more layers through laser irradiation or chemical etching. The polymeric or scaffolding structure can be one or more block co-polymers. In one embodiment, the method can further include the step of applying a capping or substrate.

BRIEF DESCRIPTION OF THE DRAWINGS

The present disclosure may be more fully appreciated in connection with the following detailed description taken in conjunction with the accompanying drawings, wherein.

DETAILED DESCRIPTION OF PREFERRED EMBODIMENTS

Figure 1:
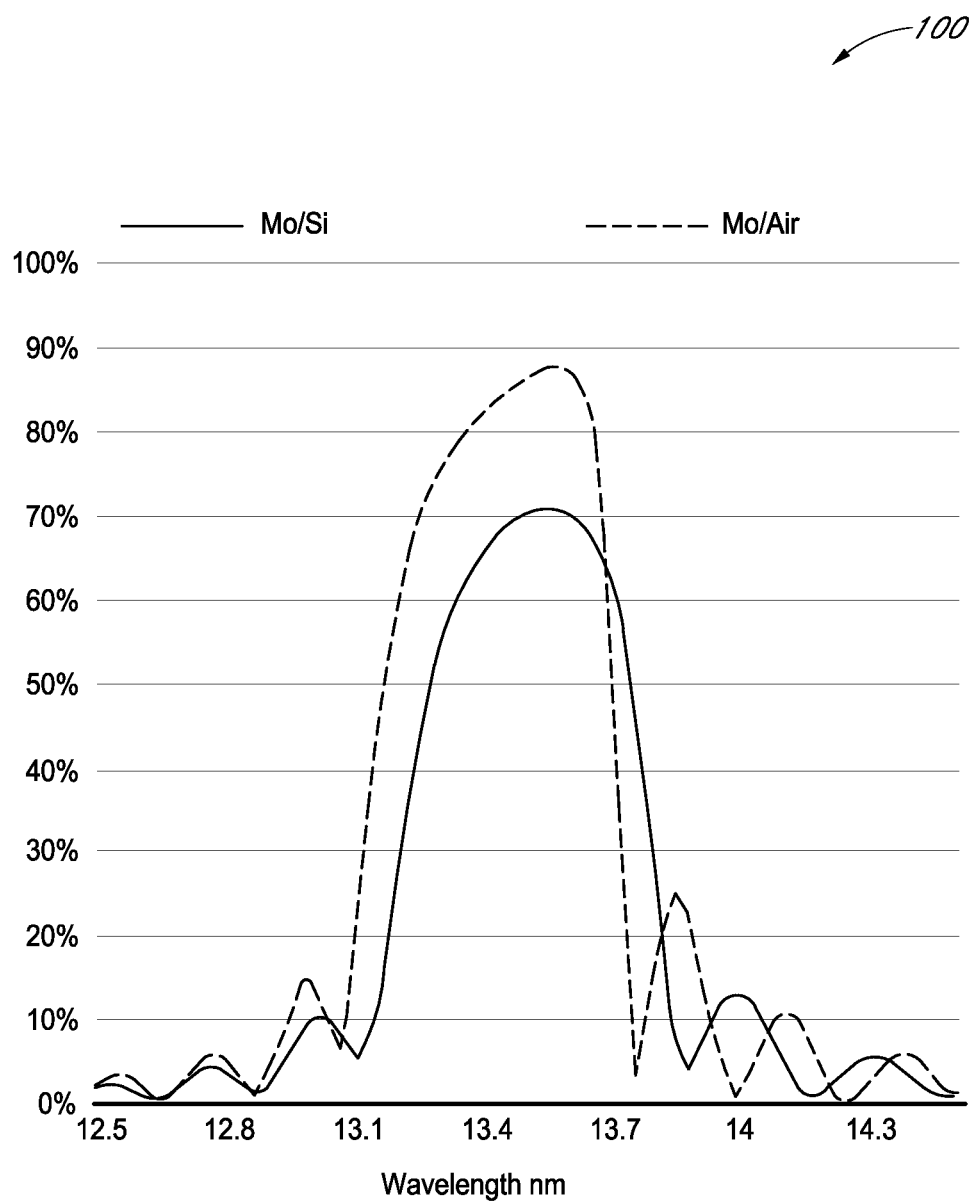
FIG. 1 illustrates details of reflectivity characteristics of a Mo/Si multilayer stack at EUV wavelengths compared to a structure of a material described herein.

Lithography using extreme ultraviolet radiation may enable fabrication of devices with smaller feature sizes. However, most materials have a high absorption for electromagnetic radiation in the EUV spectrum. The choice of natural materials with a low absorption rate in the EUV spectrum is limited. Accordingly, the high absorption of most materials affects the performance of EUV lithography (EUVL) systems. For example, high levels of optical power might be required to operate a EUVL system. The system might also require an extensive heat management system because of the increased optical power.

This disclosure describes materials that can improve performance of EUVL systems. The disclosure further describes fabrication of these materials and using these materials in components, apparatus, and devices of a EUVL system. The materials, methods, and systems described here can also be used in systems where the electromagnetic radiation is in the ultraviolet and the soft x-ray wavelengths.

The materials can further improve performance in non-lithography systems which may use UV, EUV, or soft X-ray wavelengths. For example, lamps and light sources, biological (e.g. biological assay and array development), botanical systems, imaging and microscopy systems, sensor activation, fluorescence, quantum dots, astronomy systems, material processing systems and atomic, nuclear and particle emission radiation, acceleration systems, space systems.

As used herein, UV radiation is electromagnetic radiation in the wavelength range of approximately 400 nanometers to 120 nanometers, EUV radiation is electromagnetic radiation in the wavelength range of approximately 120 nanometers to 1 nanometers, and soft X-ray radiation is electromagnetic radiation in the wavelength range of approximately 1 nanometers to 0.01 nanometers. The selected wavelength range may be part of a two or more photon process which may be equivalent to an excitation in the UV, EUV or X-ray range. Some differences in definition may exist in the general literature, but the intended region is approximately the same. In addition, the intended range intends to encompass radiation defined as XUV radiation.

This disclosure also describes systems, apparatus, and methods, which employ UV, EUV, XUV, soft X-ray radiation for applications in biomaterial development, printing and patterning, microscopy, material processing, astronomical systems, light exposure, imaging and scanning systems. More specifically, the applications can include 3D printing, selective biomaterial patterning, biosensor activation, DNA/peptide patterning, quantum dot activation, fluorescence microscopy, selective biomaterial activation.

The disclosure describes materials that can be used in extreme ultraviolet wavelength applications. The material may include features that can be used in applications that require operation at one or more electromagnetic wavelength range. In one embodiment, the dimension of structural features is approximately in the same order as the wavelengths used in extreme ultraviolet applications. For example, the structural features can have a dimension of approximately 13.5 nm. In some embodiments, the features may be structural features having dimensions in the order of 10 to 20 nm. In another embodiment, the material can have structural features in the range of 0.001 nm to 10 nm. In yet another embodiment, the material can have structural features in the range of 10 nm to 250 nm. These features can be referred to as nanoscale features. The nanoscale features may be one dimensional, two dimensional, or three dimensional. The structural features can reduce the bulk electromagnetic absorption of the material. For example, in some applications, the nanoscale features can approximately correlate with the wavelength of the radiation used in that application. The material may include sub-wavelength features.

The materials can also be designed to reduce absorption in applications that use ultraviolet (UV) wavelength range. For example, the dimension of the structural features can correlate to the UV wavelengths. In other embodiments, the dimensions of the structural features can correlate to the soft X-Ray wavelength range. The selected wavelength range may be part of a two or more photon (multiphoton) process which replaces the UV, EUV or X-ray range.

The nanoscale features may include, for example, a periodic or semi-periodic, quasi-periodic or aperiodic structure or a repeating or repeated element. The periodic structure may be a one, two or three dimensional structure. The structure may be part of a layered structure, or on a substrate. The substrate may be planar or non-planar or freeform. Examples of a periodic structure include a 2D or 3D array of nanoparticles, a gyroidal structure, a swiss-roll structure. The nanoscale features can be of any shape in any dimension, for example, but not limited to, layers, films, spheres, blocks, pyramids, rings, porous structures, cylinders, linked shapes, shells, freeform shapes, chiral structures, hemispheres, segments or any combination thereof.

The material may include, for example, a graded structure. For example a layered structure in any dimension where some layers within the material have lengths, depths, thicknesses, periods or repeating units, that increase or decrease from the previous layer. In one embodiment if the layers are arranged in such a way to produce a graded refractive index, then a customized optical response is produced for a broader range of wavelengths or angles. The structure may be part of a layered structure, or on a substrate. The substrate may be planar or non-planar or freeform.

Figure 2:
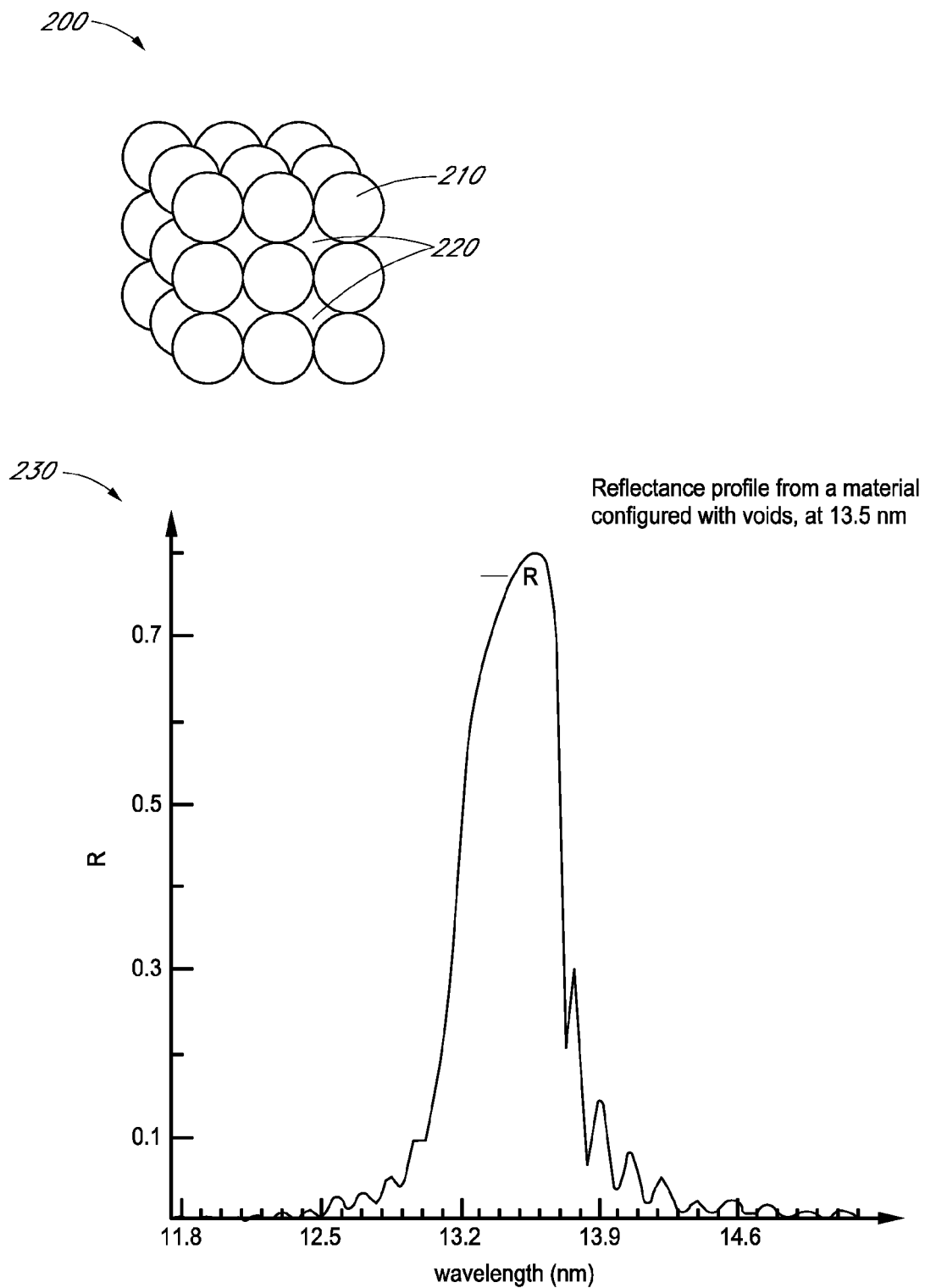
FIG. 2 illustrates an embodiment of a three dimensional structure containing structural features and an example reflectance profile from a structure containing voids at EUV wavelengths.

FIG. 2 illustrates an embodiment of 3D array with voids. The material 210 may include gaps or voids 220 of any shape. The gaps or voids 220 may be distributed throughout the material 210 in any dimension and can have sizes ranging from 0.01 nm to micron sizes. The gaps or voids 220 may be filled with a fluid, a liquid gas, monatomic material, organic material, polymer or vacuum. The material may include membranes, free standing structures or elements, or partially supported structures or features, or supporting structure. The features may be supported by structures or components. The gaps may be periodic or random in distribution. The gas may include $O_2$, H2, He, $N_2$, Ar, $CO_2$ or other gases including non-inert gases. An example is a 3D periodic array 200 of metallic spheres 210 with air gaps 220. If the system is under vacuum, then the voids 220 may also include vacuum. FIG. 2 also illustrates a reflectance profile 230 from a material that may include voids. As shown in FIG. 2, the reflectance 230 is more than 70% at wavelength of approximately 13.5 nm.

The material may further include micro or nano structural features of the monatomic material. Some examples of the monatomic material include graphene, graphite, molybdenum sulphide, and carbon nanotubes. The monatomic material may serve as an optical element or a heat management or cooling mechanism element. The monatomic material may be used in combination with other materials e.g. a metal, dielectric, semiconductor. It may form part of a layered structure, periodic structure, multidimensional or freeform structure, or be on a substrate.

The material may be an organic material or a biomaterial. The material may further comprise micro or nano structural features of the organic or bio material. Examples of organic materials or biomaterials, include DNA, proteins, or other molecular or genomic material which have lower absorption in the wavelengths. The organic material or biomaterial may also be a sacrificial material, or a soft templating or scaffolding structure. The organic or bio material may be encapsulated in other material, which include, but not exclusively, polymers or dielectrics or semiconductors. The organic or bio material may serve as an optical element or a heat management or cooling mechanism element. The organic or bio material may be used in combination with other materials e.g. a metal, dielectric, semiconductor. It may form part of a layered structure, periodic structure, multidimensional or freeform structure, or be on a substrate.

The material can also include a polymer. The material may further comprise micro or nano structural features of the polymer. The polymer may also be a sacrificial material, or a soft templating or scaffolding structure. In some embodiment, the polymer may be removed, leaving gaps or voids in the material. These gaps or voids may form structural features in the material. In other embodiments, the polymer can remain in the material. The polymer may be photoresist. The polymer may also be irradiated and exposed by a laser or a two or more photon laser process.

The material may include nanoscale features that are made using metals, semiconductors, alloys, dieletrics, compounds, gases, liquids or combinations of these. These nanoscale structures can be engineered to reduce absorption by the material at one or more band of wavelengths. The metal may include for example gold, silver, platinum, molybdenum, beryllium, ruthenium, rhodium, niobium, palladium, copper, lanthanum. The combined material may include for example silicon, silicon dioxide, boron carbide, carbon, organic, biomaterial, germanium, polymers or monatomic materials, liquids or gases or other element, alloy or compound, or vacuum. In this case, a either material can have a a small amount of absorption as described by the imaginary part of the refractive index, where one material has more than the other.

The material may have nanosized structures and features which form an array or are periodic in one, two or three dimensions, for example, but not limited to, a photonic crystal, plasmonic crystal, metamaterial, chiralic structure or sub-wavelength structure. Features of the array may be tuned to optimize the wavelength, spectral bandwidth, photonic bandgap angular acceptance, reflectance including average reflectance (when averaged over the spectral range), transmission, absorption, scattering and electromagnetic enhancement factor, resonance or interaction modes. The structure may provide a cavity which slows the group velocity of light to increase electromagnetic interaction, or form a waveguide or cavity where certain electromagnetic nodes are enhanced and certain nodes are forbidden. In the case of forbidden modes of propagation, this may be used to form a selective or omnidirectional mirror with tunable peak wavelength and spectral bandwidth properties. The cavity can also be used to enhance the conversion of light from infrared to EUV, as may be needed in a two or more photon process, or a lightsource emitting EUV radiation from infrared excitation e.g. a plasma source.

The nanoscale features of the material may, for example, be configured as a 3D hexagonally packed array. The 3D hexagonally packed array may include a metal. The metal may be, for example, gold, silver, ruthenium, molybdenum, silicon, germanium, or platinum, palladium or other metal. See FIG. 2.

The nanoscale features of the material may, for example, include a gyroid structure. The gyroid structure can be a metal, for example, gold, silver, ruthenium, molybdenum, silicon, germanium, or platinum.

The nanoscale features of the material may, for example, be made using graphene or molybdenum graphene (Mo-Graphene). The nanoscale features may include a graphene double gyroid structure.

The nanophotonics material may include a periodic one, two or three-dimensional structure engineered to have a low bulk absorption of electromagnetic radiation at selected wavelengths, such as at UV, EUV, or soft X-ray wavelengths.

This disclosure further describes methods, apparatus and techniques used to fabricate the material. The EUV materials can be fabricated using top down fabrication procedures, where materials are deposited onto a flat substrate via electrodeposition in a controlled vacuum environment. The deposited material can have a thickness of approximately 5 nm or less and a roughness factor less than lambda/20. A low roughness factor may be preferred due to the Mie scattering from anomalies which reduce the overall reflectance or transmission of the material. Depositing ultraflat materials with sufficiently low roughness can be challenging. When multiple materials or a layered structure is used, each material and layer can be individually smoothed or polished.

In some embodiments, the EUV material can be fabricated using a bottom up approach. In the bottom up fabrication approach, the bulk material can be gradually grown by inserting matter from the bottom end of the structure, thereby only requiring one surface (the topmost outer layer) for smoothing. The bottom up approach can be used to fabricate lithography based materials for use in the UV, EUV and soft X-ray ranges of wavelengths.

Figure 6:
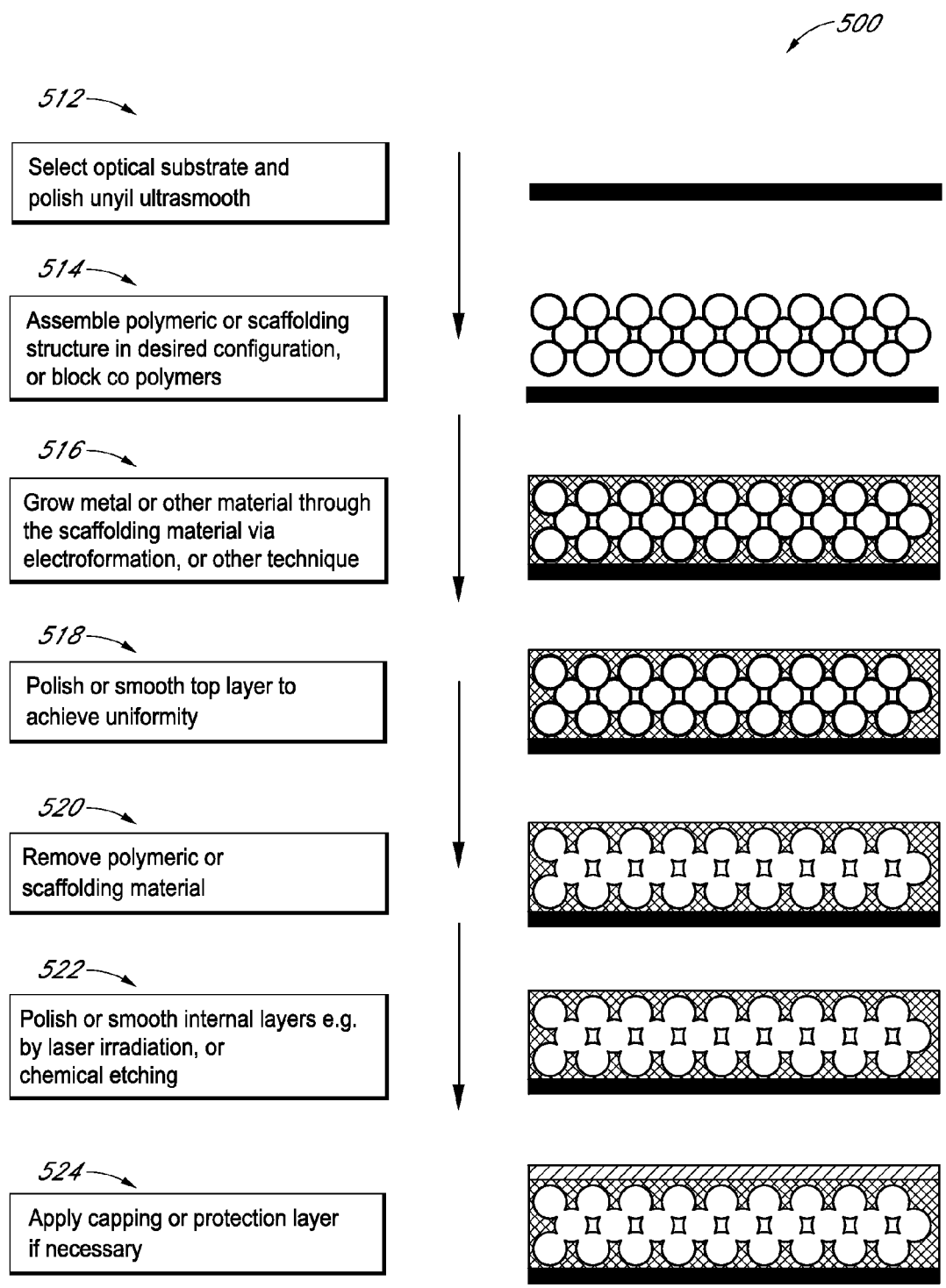
FIG. 6 shows an embodiment of a fabrication process to make a material described herein using a polymeric template.

In one embodiment, the material optimized for a particular wavelength can be fabricated using a soft templating approach. In the soft templating approach, certain polymers or sacrificial or temporary materials, but not exclusively, may be temporarily used in conjunction with electrodepostion and other material deposition techniques. The sacrificial materials or polymers form a soft template, or scaffolding structure, which may later be removed once the actual material is in place. The sacrificial or temporary material may be removed by chemical etching or other methods. An example of a sacrificial material may be photoresist. Another example of a temporary material is a nanosphere. The soft templating approach can be used to fabricate lithography based materials optimized to reduce absorption for one or more of the wavelengths or range of wavelengths in the UV, EUV and the soft X-ray range. These EUV materials can be further used to manufacture elements for lithography systems. FIG. 6 illustrates an embodiment of a method for fabrication materials described herein using a polymer based soft templating approach. The method 500 can include the step of polishing a host layer 512. In some embodiments, the method can further include the step of assembling a polymeric or scaffolding structure 514. Moreover, the method can include growing a main layer over the scaffolding structure 516. The method can also include polishing the surface of the main layer 518. Furthermore, the method can include the step of removing the polymeric or scaffolding structure 520 so that the reflectivity of the material is greater than 70% at a wavelength between 0.1 nm and 250 nm. In some embodiments, the method can include the step of smoothing one or more layers through laser irradiation or chemical etching 522. The polymeric or scaffolding structure can be one or more block co-polymers. In one embodiment, the method can further include the step of applying a capping or substrate 524.

The EUV material can also be fabricated using an electroformation or other similar process. In electroformation a material, e.g. a metal, is grown through another material by chemical, electrical or magnetic means. This method can be used in the electroformation of the metal molybdenum and ruthenium, which are not commonly electroformed metals. The electroforming process can be used in the fabrication of lithography based materials at UV, EUV and soft X-ray range.

The EUV materials can be further fabricated using a self-assembly or other similar process. In self-assembly, certain aspects of the material, e.g. nanoscale features are assembled together to form the overall bulk structure. The assembly formation may either be self-assembly or a directed assembly. In one embodiment, the features may retain a given rigid structure through chemical or electrical or magnetic means. An example of this is a chemically polarized material. In another embodiment, the substrate of the material may be pre-patterned to ensure a preferential structure or embodiment of the bulk material disposed on top of it. In another embodiment, the substrate may be surface treated with an organic or biomaterial or chemically treated to ensure a preferential or selective structure or embodiment of the bulk material disposed on top of it. The self-assembly approach can be used to fabricate lithography based materials for use in the UV, EUV, and soft X-ray ranges of wavelengths.

The material can also be fabricated using a folding process. In the folding process the material or a subset of the material may be folded, or bent or hinged, to add a higher dimension to the overall material structure. For example, but not limited to, a metallo-dielectric 2D array may be folded to form 3D hierarchical object where the overall bulk material reveals a stacked structure of multiple units of the original material.

The material may also be fabricated using a building block process. In the building block process, the material or a subset of the material may be assembled or stacked to create an overall bulk material structure. For example, but not limited to, a metal semiconductor, 3D array may be stacked in any configuration to form a 3D bulk material object where the overall bulk material reveals a stacked structure of multiple units of the original material.

The material may for example be fabricated by a chemical etching process. Chemical etchants (e.g. acids) may also be used to selectively remove material in semiconductors or polymers or metals In some embodiments, the material may be fabricated using dealloying process. In this method, the material may include a metal. The metal may be mixed with another auxiliary metal e.g. via a heating/melting process to form an ingot. An acid which may be corrosive can be used to then selectively remove the auxiliary metal e.g. gold or silver, to leave a porous structure of the original material. The remaining structure may form a uniform and smooth surface at the atomic level.

The EUV material or any subset or element of the material can be further polished or smoothed using a laser. The laser may have a pulse duration in the femtosecond or picosecond range. The laser may be used prior, during or after the fabrication. The laser may also be used to irradiate the material post fabrication to efface, remove, clean or dislodge any defects, anomalies or non uniformities. This includes removal of defects which are not directly involved in the fabrication process. For example in embodiment of the material on a photomask. The photomask while in may receive a defect particle from another part of its fabrication process, or a defect particle from a stray ion/element in the lithography or lightsource system. The photomask can subsequently be cleaned by a laser irradiation process.

In some embodiments, a nanoscale structural feature or building block or element of the material may further be manufactured by laser. The laser may be used prior during or after the fabrication. The laser approach may be part of a two or more photon process approach.

The material or any subset or element of the material may further be polished or smoothed using a chemical etchant with a controlled concentration. In one embodiment, the material or any subset or element of the material can be further smoothed using a surfactant, or chemically treated surface, during the formation of the material. The surfactant may be removed later. The chemical surfactant approach can be used to fabricate photonic structure formations for use in the UV, EUV and the soft Xray range.

The material or any subset or element of the material, or nanoscale feature may also be manufactured by a lithography or printing or patterning process. The lithography or printing process may include for example, e-beam lithography, nanoimprint lithography, UV, EUV or X-ray lithography, 2D or 3D lithography, stereolithography, focused electron or ion beams, scanning tunneling microscopy, scanning probe lithography, atomic force microscopy, sol-gel nanofabrication, two or more photon lithography, dip pen lithography, near field lithography, laser assisted imprinting, temperature based patterning, laser based patterning. In addition, an etching or deposition or temperature process may be used in combination with the lithography or printing process. The lithography or printing approach can be used to fabricate lithography based materials at UV, EUV and soft X-ray range and used in lithography devices, systems or apparatus.

In another aspect, the disclosure relates to a method of making a material including nanoscale features for use at a selected electromagnetic wavelength range. The material may be a material as described herein for elements or devices used for lithography or other optical applications. The material can also be fabricated using a block copolymer scaffold process. The method may include, for example, fabricating a block copolymer structure having at least a first block and a second block. The method may further include removing the first block, and replacing at least a portion of a volume of the structure occupied by the first block with a metal or semiconductor or polymer, dielectric or monatomic material. The block co-polymer approach can be used to fabricate lithography based materials for use in the UV, EUV, and soft X-ray ranges of wavelengths.

The first block may be, for example, a selectively degradable block. The method may further include removing the second block and/or removing any additional blocks, in whole or in part. The second block and/or any additional blocks may be removed using a process such as plasma etching Replacement of at least a portion of the volume may include, for example, electrochemically depositing the metal or semiconductor. Replacement of at least a portion of the volume may include electrodeposition or electroformation of the metal or semiconductor.

In another embodiment, the material can be fabricated using a swiss roll or a laminate process. In the swiss roll process, the material or a subset of the material may be rolled from one end to add a higher dimension to the overall material structure, and a cross section of the overall material appears as multiple formations of the material. For example, but not limited to, a metallo-dielectric 2D array may be rolled from one end to form a 3D cylindrical object where the cross-section of the cylindrical object, perpendicular to the axis, can reveal a stacked structure of multiple units of the original material.

In another aspect, the disclosure relates to an element of a system or subsystem. The element may include a material having nanoscale features designed to be at least partially reflective or transmissive to electromagnetic radiation, or electromagnetic interaction enhancement, in a selected electromagnetic wavelength range. The material may be a material such as described previously or subsequently herein. The material may be disposed on an element, or embedded within the element, or embedded within a radiation emitting system or element within a radiation emitting system, or radiation monitoring device at the selected wavelength range.

Figure 3:
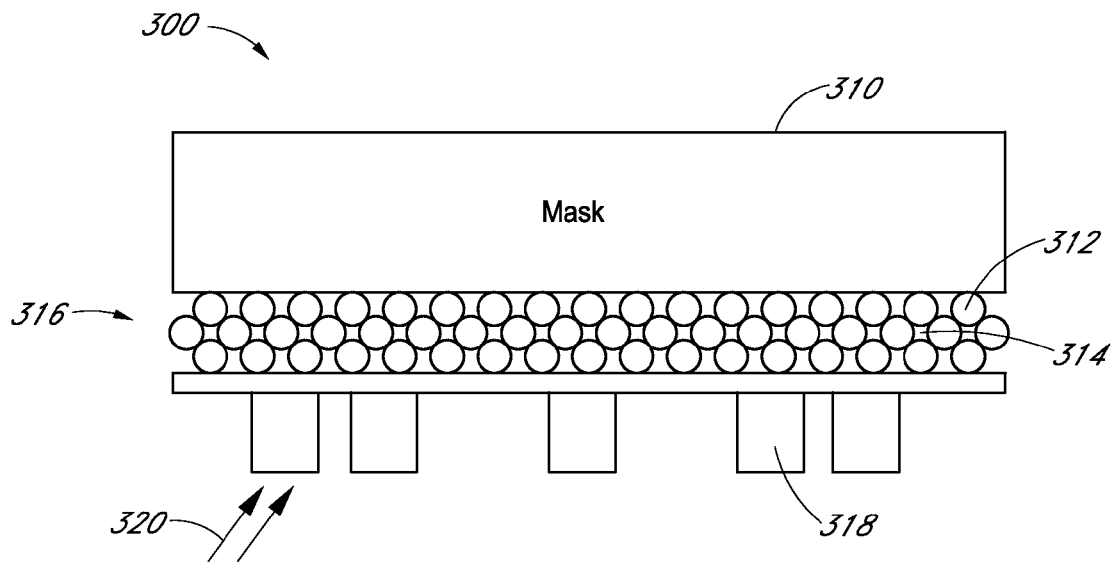
FIG. 3 illustrates an embodiment of a photolithography mask with a material described herein.

In one embodiment, the system or subsystem is a lithography system. The elements may be one of the components of the lithography system. For example, elements can include, but not limited to, a photomask, a detector, a wavelength monitor, bandwidth or power monitor, sensors, photoresist, a substrate, a cooling mechanism, a heat management mechanism, light source, lamp, laser, optical element, mask aligner, integrator, structural component, electrical device, optical device or any other component contained within the system. The system or subsystem may also include a semiconductor manufacturing device or apparatus. FIG. 3 illustrates an element 300 (photomask, in this example) that can include a material 316. The mask 300 can receive radiation 320 of a selected wavelength. In one embodiment, the material 316 can be a 3-D array, 312 and 314 as described with respect to FIG. 2. In other embodiments, the material 316 can be any of the materials described herein that can increase reflectance of the element 300. In some embodiments, the reflectivity of the element 300 can be increased to more than 70% for a selected wavelength. The wavelength can be between 0.1 nm and 250 nm. The material 316 can be integrated in the mask 300 as illustrated in FIG. 3. In one embodiment, the material 316 is sandwiched between the top 310 and bottom 318 layers of the mask 300. Other methods of affixing the material 316 can also be used.

It should be noted that in addition to lithography systems, the materials described above can also be used in a biotech system, a 2D or 3D printing or patterning system, or a material processing system. These systems can also include elements that can use EUV materials to improve performance. Elements can include, for example, a photomask, a detector, a wavelength monitor, bandwidth or power monitor, sensors, photoresist, a substrate, a cooling mechanism, a heat management mechanism, light source, lamp, laser, optical element, mask aligner, integrator, structural component or any other element or component contained within the system. In some embodiments, the EUV materials can be used in a projection lens system. For example, in this system, instrumentation may include multiple optical elements at the selected wavelength range e.g. a telescope or a satellite.

Another example of a system where EUV materials can be used is a system that involves detection at the selected electromagnetic wavelength range, for example, X-ray detection, imaging and scanning systems, radiation from nucleic particles, and accelerator systems, biotechnology systems. EUV materials can also be used in scanning and imaging systems. EUV materials can also be used in systems that require reduced absorption in one or more ranges of operating wavelengths.

Figure 5:
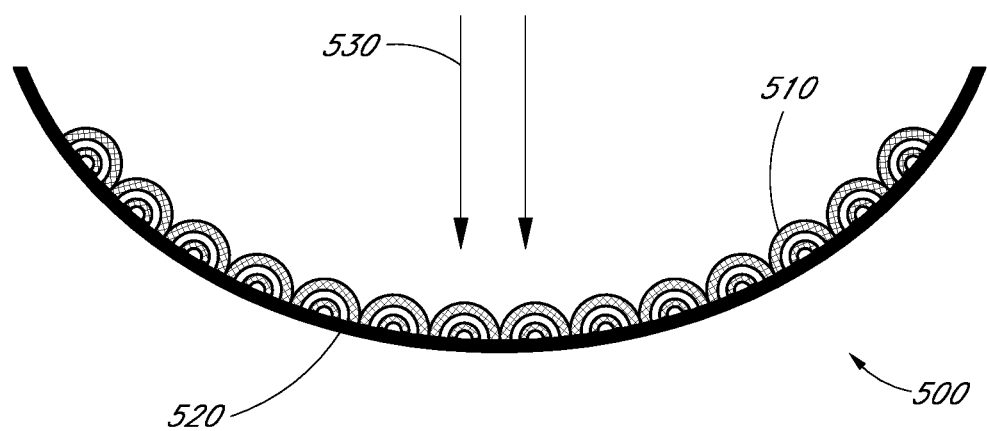
FIG. 5 shows an embodiment of an optical element or surface with a material described herein.

In one embodiment, the element is an optical element. The optical element may include an optical substrate, mirror, lens, surface, window, facet, filter, covering element, capping layer, barrier layer, thin film, coating, internal surface area, collector, droplet generator, interdispersed material, panel, waveguide, cavity, fiber, structural component, reflective element, transmissive element, a detector, a wavelength monitor, bandwidth or power monitor, sensors, electrical device or optical device, or any other optical elements that may be used in systems described above. The optical substrate can be fused silica, or calcium fluoride, or magnesium fluoride. The optical element may also be neither transmissive nor reflective, but serve to increase the electromagnetic interaction with a certain region. For example it may enhance certain electromagnetic mode so radiation, form a cavity, or increase internal surface area available for interaction. FIG. 5 illustrates an embodiment of an optical element 500 where a material 510 is disposed on top of the surface 520 of the optical element 500. The materials can be affixed with the optical element 500 using other methods not shown here. The optical element 500 can receive radiation 530 of a selected wavelength. In one embodiment, the material 510 can be a 3-D array as described with respect to FIG. 2. In other embodiments, the material 510 can be any of the materials described herein that can increase reflectance of the optical element 500. In some embodiments, the reflectivity of the optical element 500 can be increased to more than 70% for a selected wavelength. The wavelength can be between 0.1 nm and 250 nm. The optical element can be used with any of the systems described herein.

Figure 4:
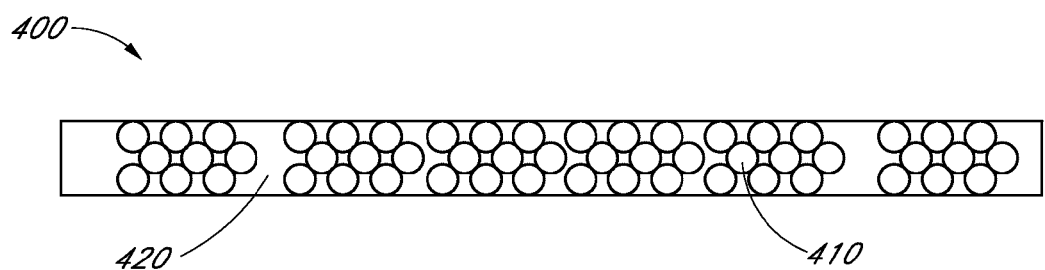
FIG. 4 shows an embodiment of a photoresist with a material described herein.

FIG. 4 illustrates an embodiment of a material-photoresist composite 400. The material 410 can be embedded or interdispersed in a host material, e.g. photoresist 420. The material can improve the performance of the host material 420. In the case of photoresist, the increase in electromagnetic interaction i.e. scattering and absorption with the polymer or organic material can increase the sensitivity of the photoresist.

In another aspect, the disclosure relates to a reflective element. The reflective element may include a material having nanoscale features configured to be at least partially reflective to electromagnetic radiation in a selected electromagnetic wavelength range. The material may be a material such as described previously or subsequently herein.

The reflective element may be, for example, an optic or a component of an optic. The optic may be, for example, a mirror, lens, optical window, filter or coating, thin film, membrane or substrate or other optical element. Alternately, the reflective element may be a component of a mask or a coating or layer of material of the mask. The mask may be a photolithography mask. Alternately, the reflective element may be a photoresist or an element of a photoresist. The photoresist may be a photolithography photoresist. The reflective element may be, for example, a component or element of a lithography device or system, such as an EUVL system, or a soft X-ray system.

The reflective element may be, for example, a coating or layer of material disposed on or in an optic, photoresist, mask, or other component or device. The optic may be a fused silica or calcium fluoride optic.

The reflective element may be, for example, configured as a component of a photolithography device. The reflective element may be configured as a component of an electromagnetic radiation source device. The reflective element may be configured as a component of a semiconductor manufacturing device or other device using UV, EUV, or soft X-ray electromagnetic radiation. The reflective element may be a component of a UV, EUV, or X-ray lightsource.

The reflective element may include a material having nanoscale features configured to be partially reflective in the selected electromagnetic wavelength range. Alternately, or in addition, the reflective element may include material having nanoscale features configured to be substantially fully reflective in the selected electromagnetic wavelength range. In some embodiments, the reflective element may include material having structural features configured to have a reflectivity of greater than or equal to 70%.

The reflective element may include a material having nanoscale features configured to be reflective in the selected electromagnetic wavelength range where the material can be consistently fabricated to have a reflectivity greater than or equal to 70%.

The reflective element may include a material having nanoscale features configured to increase spectral bandwidth in the electromagnetic wavelength range. An example of this would be a graded structure.

The reflective element may include a material having nanoscale features configured to increase angular acceptance in the electromagnetic wavelength range. An example of this would be a 2D or 3D symmetric structure.

The reflective element may include a material having nanoscale features configured to increase average reflectance (integrated or averaged over the spectral range) in the electromagnetic wavelength range.

In another aspect, the disclosure relates to a transmissive/transparent element. The transparent element may include a material having nanoscale features configured to be at least partially transmissive (greater than or equal to 4%) to electromagnetic radiation in a selected electromagnetic wavelength range. The material may be a material such as described previously or subsequently herein. The transparent element may be, for example, a component or element of a lithography device or system, such as an EUVL system, or a soft X-ray system or a biotechnology or material processing system.

The transparent element may be, for example, an optic or a component of an optic. The optic may be, for example, a mirror, lens, optical window, or other optical element. Alternately, the transparent element may be a component of a mask or a coating or layer of material of the mask. The mask may be a photolithography mask. Alternately, the transparent element may be a photoresist or an element of a photoresist. The photoresist may be a photolithography photoresist.

The transparent element may be, for example, a coating or layer of material disposed on or in an optic, photoresist, mask, or other component or device. The optic may be a fused silica or calcium fluoride optic.

The transparent element may be a component of a photolithography device. In some embodiments, the transparent element can be a component of an electromagnetic radiation source device. The transparent element may also be configured as a component of a semiconductor manufacturing device or other device using UV, EUV, or soft Xray electromagnetic radiation. The transparent element may be a component of a UV, EUV, or X-ray light source. The transparent element may be a component of an optical window or a coating or layer of material disposed on or in the optical window.

In another aspect, the disclosure relates to means for fabricating and using the above-described nanophotonics materials and related methods, in whole or in part.

In another aspect, the disclosure relates to methods of using such nanophotonics materials in systems such as extreme ultraviolet lithography (EUVL) or soft Xray lithography systems or other systems.

In another aspect, the disclosure relates to components, devices, and systems including the above-described nanophotonics materials, in whole or in part.

Various additional aspects, features, and functionality are further described below in conjunction with the appended Drawings.

The exemplary embodiments described herein are provided for the purpose of illustrating examples of various aspects, details, and functions of apparatus, methods, and systems for inspecting the interior if pipes, conduits, and other voids; however, the described embodiments are not intended to be in any way limiting. It will be apparent to one of ordinary skill in the art that various aspects may be implemented in other embodiments within the spirit and scope of the present disclosure.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Extreme Ultraviolet Lithography is a significant departure from other ultraviolet (UV) lithography, such as the deep ultraviolet lithography technology in general use today. EUV radiation is highly absorbed by all materials, and therefore EUV lithography typically takes place in a vacuum. Optical elements in such systems should be configured to minimize absorption of EUV radiation, however, this is difficult to implement. For example, components such as mirrors will typically absorb around 35-40% of the incident light.

Typical pre-production EUVL systems built to date contain at least two condenser multilayer mirrors, six projection multilayer mirrors, and a multilayer object (mask). Since the optics already absorbs approximately 96% of the available EUV light, an appropriate EUV lightsource will need to be sufficiently bright to overcome this loss of radiation. EUV source development has focused on plasmas generated by laser or discharge pulses. The mirror responsible for collecting the light is directly exposed to the plasma and is therefore vulnerable to thermal damage and damage from the high-energy ions and other debris. This damage associated with the high-energy process of generating EUV radiation has limited implementation of EUV light sources for lithography.

Consequently, existing EUV Lithography scanner units have poor efficiency because of these absorption properties of EUV lithography devices using traditional materials for elements such as optics, mirrors, optical windows, masks, photoresists, and other elements or components.

While one-dimensional structures may present some potential advantages, they also include limitations. For example, initial simulation analysis of a molybdenum/silicon multilayer stack configuration indicates that the maximum reflectivity obtainable from a one dimensional molybdenum/silicon multilayer stack at 90 nanometers with 50 layers of periodicity is a theoretical maximum of 70.6% at zero degrees incident angle, as shown in FIG. 1 (100). In practice the reflectivity is lower due to defects in fabrication process and Mie Scattering.

Accordingly, in some embodiments, an EUV reflective element (and associated devices) having a two or three dimensional nanoscale structure, for operating in wavelength ranges of approximately 13.5 nm and having a reflectivity of approximately 80 percent or higher, may be fabricated and used in applications such as EUVL, using techniques such as those described here. In addition, materials with similarly transmissive properties (e.g., EUV transparent materials and associate components and devices) may be similarly fabricated using techniques such as those described herein.

In another aspect, nanostructured (nanophotonics) two or three dimensional materials such as those described herein or similar or equivalent materials may be used in components & devices such as, for example, lasers and laser systems, light sources, scanners, masks, and resist materials, or other devices or systems for use in manufacturing semiconductors or other devices.

Other applications may include plasma sources or synchrotron radiation sources or other electromagnetic radiation sources. Still other applications may include excimer or other lasers, such as industrial lasers, as well as X-ray electromagnetic radiation devices or other devices for generating or using electromagnetic radiation in wavelength ranges such as infrared, visual, UV, EUV, or Xray wavelengths. Components and devices using nanophotonic materials may also be used in other applications such as biomedical devices or other devices or systems.

In some embodiments, a three dimensional graphene photonic crystal may be used as a nanophotonics material for devices and systems operating at UV, EUV and Xray wavelengths. Graphene is a recently developed material that has high thermal conductivity and can be configured to be transparent or, through use of stacking, layering or other composite configurations, made reflective or absorptive. Similarly, in some embodiments, carbon nanotubes, which have similar properties to graphene, may be used to make transparent or reflective nanophotonics materials. For example, graphene or carbon nanotube materials may be used in lithography devices as, for example, a coating or layered material. High thermal conductivity of these materials makes them advantageous for applications where transparency or reflectivity are required (e.g., at UV, EUV, and/or soft Xray wavelengths) along with a need for high conduction generated heat (e.g., high thermal dissipation in devices such as light scanning tools, machines for wafer patterning, two-photon devices, or other devices or systems where UV, EUV, and/or Xray radiation is used, such as to pattern a photoresist.

In another embodiment, a nanostructured material may be fabricated in a double gyroid structure. The double gyroid structure may comprise, for example, Gold (Au) and/or Molybdenum (Mo). The double gyroid structure may be fabricated using a block copolymer technique, such as described previously herein. Such a material may have a low metallic density with ambient air in the interstices. For example, the metallic density may be less than corresponding bulk material by, for example, a factor of 10 or greater.

Other embodiments and modifications of this disclosure may occur readily to those of ordinary skill in the art in view of these teachings. Therefore, the protection afforded this disclosure is to be limited only by the following claims, which include all such embodiments and modifications when viewed in conjunction with the above specification and accompanying drawing.

It is understood that the specific order or hierarchy of steps or stages in the processes and methods disclosed herein are examples of exemplary approaches. Based upon design preferences, it is understood that the specific order or hierarchy of steps in the processes may be rearranged while remaining within the scope of the present disclosure unless noted otherwise.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The disclosure is not intended to be limited to the aspects shown herein, but is to be accorded the full scope consistent with the specification and drawings, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the spirit or scope of the disclosure. Thus, the disclosure is not intended to be limited to the aspects shown herein but is to be accorded the widest scope consistent with the principles and novel features disclosed herein.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. In addition, the articles "a" and "an" are to be construed to mean "one or more" or "at least one" unless specified otherwise.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present.

While the above detailed description has shown, described, and pointed out novel features as applied to various embodiments, it will be understood that various omissions, substitutions, and changes in the form and details of the devices or algorithms illustrated can be made without departing from the spirit of the disclosure. Thus, nothing in the foregoing description is intended to imply that any particular feature, characteristic, step, module, or block is necessary or indispensable. As will be recognized, the processes described herein can be embodied within a form that does not provide all of the features and benefits set forth herein, as some features can be used or practiced separately from others. The scope of protection is defined by the appended claims rather than by the foregoing description.

What is claimed is:

1. An element configured to be used in a light exposure system, wherein the system or subsystem comprises a light source configured to transmit light having a wavelength, the element comprising:
   a reflective coating comprising a material having a plurality of internal voids interspersed within the material, the internal voids each having a size of between 250 nm and 0.01 nm;
   wherein the internal voids are configured to improve the reflectivity of the element to greater than 70% for incident light for a wavelength between 0.1 nm and 250 nm.

2. An element configured to be used in a light exposure system, wherein the system or subsystem comprises a light source configured to transmit light having a wavelength, the element comprising:
   a coating comprising a material having a plurality of internal voids interspersed within the material, the internal voids each having a size of between 250 nm and 0.01 nm,
   wherein the internal voids are configured to improve the transmission of the element to greater than 4% through the material for a wavelength between 0.1 nm and 250 nm.

3. An element configured to be used in a light exposure system, wherein the system or subsystem comprises a light source configured to transmit light having a wavelength, the element comprising:
   a coating comprising a material having a plurality of internal voids interspersed within the material, the internal voids each having a size of between 250 nm and 0.01 nm;
   wherein the internal voids are configured to control the electromagnetic radiation absorption for a wavelength between 0.1 nm and 250 nm, wherein the internal voids are configured to reduce or increase the bulk electromagnetic absorption of the material.

4. The light exposure system according to claim 1, 2 or 3 where the system includes a photolithography tool, biotechnology system, scanning or imaging system, astronomical system, material processing system or a printing system.

5. The element according to claim 1, wherein the size substantially correlates with the wavelength.

6. The element according to claim 1, 2 or 3, wherein the material or internal voids are one dimensional, two dimensional or three dimensional.

7. The element according to claim 1, wherein the material or internal voids have a periodicity in the material, said periodicity in one, two, or three dimensions.

8. The element according to claim 1, 2 or 3, wherein the material or internal voids are arranged in one of the following: semi-periodic, aperiodic, quasi-periodic, graded, partially graded, symmetric, fractal, gyroid, swiss roll, non-planar, segments, repeated unit, forming a pattern, or randomly or semi random order in the material.

9. The element according to claim 1, 2 or 3, wherein the material or the internal voids comprises one or more of the following: metal, dielectric, gas, liquid, compound, semiconductor, polymer, organic material, biological material, monatomic material, air, Carbon, Molybdenum, Beryllium, Lanthanum, Boron Carbide, Silicon, $SiO_2$, $TiO_2$, Ruthenium, Niobium, Rhodium, Gold, Silver, Copper, Platinum, Palladium, Germanium, DNA, proteins, graphene, graphite, carbon nanotubes, MoS, $O_2$, $N_2$, He, $H_2$, Ar, $CO_2$.

10. The element according to claim 1, wherein the element comprises a substrate, mirror, lens, surface, window, facet, filter, covering element, capping layer, protective layer, barrier layer, thin film, coating, internal surface area, collector, droplet generator, interdispersed material, panel, waveguide, cavity, fiber, structural component, reflective element, transmissive element, a detector, a wavelength monitor, bandwidth or power monitor, sensors, a photomask, photoresist, a cooling mechanism, a heat management mechanism, light source, lamp, laser, optical element, mask aligner, integrator, structural component, optical device, or an electrical device.

11. The element according to claim 1, wherein the material or internal voids have shapes or dimensions containing layers, films, spheres, blocks, pyramids, rings, porous structures, cylinders, linked shapes, shells, freeform shapes, chiral structures, hemispheres or segments.

12. The element according to claim 1, wherein the material is cleaned or post processed or smoothed by one of the following methods of processing: chemical etching, laser radiation or heating.

13. The element according to claim 1, wherein the material or subset of the material or aspect of the material is fabricated by one of the following methods of processing: self-assembly, directed assembly, soft templating, electroforming, electroplating, sacrificial or scaffolding materials, block co-polymers, bottom-up techniques, EUV or XUV lithography, focused electron or ion beams, nanoimprinting, atomic force or scanning probe microscopy, two or more photon lithography, laser irradiation, dealloying, chemical etching, chemical surfactants, surface treatments.

* * * * *